(12) United States Patent
Wang et al.

(10) Patent No.: US 11,036,508 B2
(45) Date of Patent: Jun. 15, 2021

(54) MICROPROCESSOR FOR METERING ELECTRIC ENERGY, MICROCONTROLLER UNIT THEREOF, AND CIRCUIT AND METHOD FOR METERING ENERGY ACCUMULATION

(71) Applicant: HANGZHOU VANGO TECHNOLOGIES, INC., Zhejiang (CN)

(72) Inventors: Yajie Wang, Zhejiang (CN); Nick Nianxiong Tan, Zhejiang (CN)

(73) Assignee: HANGZHOU VANGO TECHNOLOGIES, INC., Zhejiang (CN)

( * ) Notice: Subject to any disclaimer, the term of this patent is extended or adjusted under 35 U.S.C. 154(b) by 10 days.

(21) Appl. No.: 16/749,980

(22) Filed: Jan. 22, 2020

(65) Prior Publication Data

US 2021/0096865 A1 Apr. 1, 2021

(30) Foreign Application Priority Data

Sep. 29, 2019 (CN) .......................... 201910931207.3

(51) Int. Cl.
G06F 9/30 (2018.01)
G06F 7/498 (2006.01)
G01R 22/06 (2006.01)
G06Q 50/06 (2012.01)

(52) U.S. Cl.
CPC .......... *G06F 9/30145* (2013.01); *G06F 7/498* (2013.01); *G06F 9/3001* (2013.01); *G06Q 50/06* (2013.01); *G01R 22/061* (2013.01)

(58) Field of Classification Search
CPC ...... G06F 9/3001; G06F 7/498; G01R 22/061
See application file for complete search history.

(56) References Cited

U.S. PATENT DOCUMENTS

| 4,999,572 A * | 3/1991 | Bickford | G01R 35/04 250/233 |
| 2011/0196629 A1* | 8/2011 | Coutelou | G01R 22/063 702/62 |
| 2016/0282399 A1* | 9/2016 | Veroni | G01R 35/04 |

* cited by examiner

*Primary Examiner* — Zachary K Huson
(74) *Attorney, Agent, or Firm* — Yue (Robert) Xu; Apex Attorneys at law, LLP

(57) ABSTRACT

A microprocessor for metering electric energy, a microcontroller unit thereof, and a circuit and a method for metering energy accumulation. The circuit for metering energy accumulation includes a calculation-comparison circuit and a counter circuit that are connected. The calculation-comparison circuit is configured to: calculate an accumulation of a value of power in power consumption data and a value of current energy, and a difference between the accumulation and a preset threshold; output a flag bit, characterizing whether the difference being less than zero, to the counter circuit; set the value of current energy to be the difference in a case that the difference is not less than zero; and set the value of current energy to be the accumulation in a case that the difference is less than zero. Calculation in electric energy metering is specifically implemented, effectively improving electric energy metering efficiency and product economic benefit.

10 Claims, 3 Drawing Sheets

US 11,036,508 B2

MICROPROCESSOR FOR METERING ELECTRIC ENERGY, MICROCONTROLLER UNIT THEREOF, AND CIRCUIT AND METHOD FOR METERING ENERGY ACCUMULATION

This application claims the priority to Chinese Patent Application No. 201910931207.3, titled "MICROPROCESSOR FOR METERING ELECTRIC ENERGY, MICROCONTROLLER UNIT THEREOF, AND CIRCUIT AND METHOD FOR METERING ENERGY ACCUMULATION", filed on Sep. 29, 2019 with the China National Intellectual Property Administration, the content of which is incorporated herein by reference.

FIELD

The present disclosure relates to the technical field of electric energy metering, and particularly, to a microprocessor for metering electric energy, a microcontroller unit thereof, a circuit for metering energy accumulation, and a method for metering energy accumulation.

BACKGROUND

Generally, there are two chips in a smart electric meter. One is an energy metering analog front end for processing active and reactive power data. The other is a microcontroller unit (MCU), mainly for reading power and performing accumulation calculations. At present, MCUs in most conventional electric meters is a general-purpose MCU, such as ARM Cortex M0. Most commercial general-purpose MCUs apply an ARM core of Cortex-m series. Such core may have a good control effect in various control areas, while a performance such as efficiency in calculation is not satisfactory, especially in a process of electric energy metering.

In view of the above, it is urgent to provide a solution addressing above technical issues for those skilled in the art.

SUMMARY

An object of the present disclosure is to provide a microprocessor for metering electric energy, a microcontroller unit (MCU), a circuit for metering energy accumulation, and a method for metering energy accumulation, so as to effectively improve electric energy metering efficiency and product economic benefit of a MCU through a specific design of a calculation process in electric energy metering.

In a first aspect, a circuit for metering energy accumulation is provided, including a calculation-comparison circuit and a counter circuit that are connected. The calculation-comparison circuit is configured to: calculate an accumulation of a value of power in power consumption data and a value of current energy, and a difference between the accumulation and a preset threshold; output a flag bit, characterizing whether the difference being less than zero, to the counter circuit; set the value of current energy to be the difference in a case that the difference is not less than zero; and set the value of current energy to be the accumulation in a case that the difference is less than zero.

The counter circuit is configured to output an energy metering pulse in the case that the difference is not less than zero.

In one embodiment, the calculation-comparison circuit includes: a power register configured to refresh the value of power in the power consumption data, an energy register configured to store the value of current energy, a threshold register configured to store the preset threshold, an adder, a subtractor, and a first multiplexer.

Input ends of the adder are connected to the power register and the energy register, respectively, for calculating the accumulation. An output end of the adder is connected to a first input end of the first multiplexer. An output end of the first multiplexer is connected to the energy register.

Input ends of the subtractor are connected to the adder and the threshold register, respectively, for calculating the difference between the accumulation and the preset threshold and generating the flag bit. An output end of the subtractor for the difference is connected to a second input end of the first multiplexer. An output end of the subtractor for the flag bit is connected to a selection control end of the first multiplexer and the counter circuit.

In response to the difference being positive, the first multiplexer is configured to output and write the difference to the energy register. In response to the difference being negative, the first multiplexer is configured to output and write the accumulation to the energy register.

In a second aspect, an MCU for metering electric energy is provided, where the MCU is of a three-stage pipeline structure, and includes an instruction fetch module, a decoding module, and an execution module. The execution module includes the aforementioned circuit for metering energy accumulation.

In one embodiment, the instruction fetch module includes: a program counting generator, configured to determine an address of a to-be-fetched instruction; and a compressed-instruction decoder connected to the PC generator, configured to fetch a target instruction from an instruction memory according to the address of the to-be-fetched instruction.

In one embodiment, the compressed-instruction decoder is further configured to convert the target instruction from a 16-bit instruction to a 32-bit instruction.

In one embodiment, the decoding module includes an instruction register, a controller, a decoder, a general-purpose register, a second multiplexer, and a third multiplier.

The instruction register is connected to the compressed-instruction decoder, and configured to control instruction flow. The decoder is connected to the instruction register, and configured to decode the target instruction and output the decoded target instruction to the second multiplexer and the third multiplexer. An output end of the controller is connected to a selection control end of the second multiplexer. An input end of the general-purpose register is connected to the decoder, a first output end of the general-purpose register is connected to the second multiplexer, and a second output end and a third output end of the general-purpose register are both connected to the third multiplexer.

In one embodiment, the execution module includes a data register, a multiplier or divider, an arithmetic logic unit, a fourth multiplexer, a load-store unit a forwarding unit and the circuit for metering energy accumulation.

Input ends of the data register are connected to an output end of the second multiplexer and an output end of the third multiplexer, respectively. An output end of the data register is connected to the multiplier or divider, the arithmetic logic unit, and the circuit for metering energy accumulation, for controlling data flow.

An output end of the multiplier or divider is connected to the fourth multiplexer. An output end of the arithmetic logic unit is connected to the fourth multiplexer and an address input end of the load-store unit. An output end of the circuit for metering energy accumulation is connected to the fourth multiplexer. A data input end of the load-store unit is connected to the data register, for reading from or writing into a data memory, a write-back port of the arithmetic logic unit is connected to the fourth multiplexer.

An input end of the forwarding unit is connected to an output end of the fourth multiplexer. An output end of the forwarding unit is connected to the second multiplexer, for forwarding data.

In one embodiment, the MCU for metering electric energy is a RISC-V MCU.

In a third aspect, a method for metering energy accumulation is provided, where the method is applied to any of the aforementioned MCUs for electric energy metering, and includes: obtaining the value of power in the power consumption data; and executing a pre-packaged instruction for energy accumulation, to meter electric energy based on the value of power.

The execution module of the MCU for metering electric energy when executing the energy accumulation instruction is configured to calculate the accumulation of the value of power and the value of current energy, calculate the difference between the accumulation and a preset threshold; output the energy metering pulse and set the value of current energy to be the difference, in the case that the difference is not less than zero; and set the value of current energy to be the accumulation, in the case that the difference is less than zero.

In the fourth aspect, a microprocessor for metering electric energy is provided, including any of the aforementioned MCUs for metering electric energy.

The circuit for metering energy accumulation provided according to the present disclosure includes the calculation-comparison circuit and the counter circuit that are connected to each other. The calculation-comparison circuit is configured to: calculate the accumulation of the value of power in power consumption data and the value of current energy, and the difference between the accumulation and the preset threshold; output the flag bit, characterizing whether the difference being less than zero, to the counter circuit; set the value of current energy to be the difference in the case that the difference is not less than zero; and set the value of current energy to be the accumulation in the case that the difference is less than zero. The counter circuit is configured to output the energy metering pulse in the case that the difference is not less than zero.

According to embodiments of the present disclosure, the value of power in the power consumption data is accumulated and the accumulation is compared with the preset threshold via the calculation-comparison circuit. Thereby, the energy metering pulse is outputted in a case that the accumulation is greater than or equal to the preset threshold. Calculation in electric energy metering is specifically implemented, effectively improving electric energy metering efficiency and product economic benefit. The microprocessor for metering electric energy, the MCU and the method for metering energy accumulation according to the present disclosure also have the above-mentioned beneficial effects.

BRIEF DESCRIPTION OF THE DRAWINGS

For more clearly illustrating embodiments of the present application or the technical solutions in the conventional technology, drawings referred to describe the embodiments or the conventional technology will be briefly described hereinafter. Apparently, the drawings in the following description are only some examples of the present application, and for those skilled in the art, other drawings may be obtained based on these drawings without any creative efforts, and the other drawings obtained also belong to the protection scope of the present application.

DETAILED DESCRIPTION

Embodiments of the present disclosure are to provide a microprocessor for metering electric energy, a microcontroller unit (MCU), a circuit for metering energy accumulation, and a method for metering energy accumulation, so as to effectively improve electric energy metering efficiency and product economic benefit of a MCU through a specific design of a calculation process in electric energy metering.

To make the object, technical solutions and advantages of the present application clearer, hereinafter technical solutions in embodiments of the present disclosure are described clearly and completely in conjunction with the drawings in embodiments of the present closure. Apparently, the described embodiments are only some rather than all of the embodiments of the present disclosure. Any other embodiments obtained based on the embodiments of the present disclosure by those skilled in the art without any creative effort fall within the scope of protection of the present disclosure.

At present, MCUs in most conventional electric meters is a general-purpose MCU, such as ARM Cortex M0. Most commercial general-purpose MCUs apply an ARM core of Cortex-m series. Such core may have a good control effect in various control areas, while a performance such as efficiency in calculation is not satisfying, especially in a process of electric energy metering. In view of the above, a circuit for metering energy accumulation is provided according to the present disclosure, effectively addressing the above technical issue.

Figure 1:
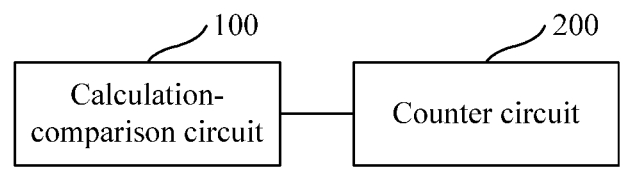
FIG. 1 is a structural block diagram of an circuit for metering energy accumulation according to an embodiment of the present disclosure.

Reference is made to FIG. 1, which is a circuit for metering energy accumulation according to an embodiment of the present disclosure. The circuit includes a calculation-comparison circuit 100 and a counter circuit 200 that are connected.

The calculation-comparison circuit 100 is configured to: calculate an accumulation of a value p of power in power consumption data and a value e of current energy, and a difference between the accumulation and a preset threshold th; output a flag bit, characterizing whether the difference being less than zero, to the counter circuit 200; set the value e of current energy to be the difference in a case that the difference is not less than zero; and set the value e of current energy to be the accumulation in a case the difference is less than zero.

The counter circuit 200 is configured to output an energy metering pulse in the case that the difference is not less than zero.

The circuit for metering energy accumulation is an important circuit in electric energy metering. In conventional technology, metering electric energy via a general-purpose MCU results in low calculation efficiency. A circuit for metering energy accumulation, which is dedicated to electric energy metering, is provided according to an embodiment of the present disclosure.

The circuit for metering energy accumulation according to this embodiment of the present disclosure includes the calculation-comparison circuit 100 and the counter circuit 200. It is appreciated that electric energy metering is actually metering accumulation of electric power. By accumulating the value p of power in the power consumption data under a certain frequency, the value of the electrical energy can be obtained. A current accumulation result of the values p of power is the value e of current energy. The value p of power in the power consumption data is obtained and refreshed under the certain frequency, and each is added to the value e of current energy. Thereby, the value e of current energy is updated according to a result of accumulation processing.

In the field of electric energy metering, electric energy is usually metered via a pulse signal. This pulse is therefore called an energy metering pulse (Energy Pulse). The energy metering pulse serves as a unit of electric energy metering. Each time electric energy of the preset threshold th is consumed in a power line, an energy metering pulse is outputted.

Since the preset threshold th is fixed, total power consumption is reflected by a quantity of the energy metering pulses. In a case that the quantity of the energy metering pulses reaches a certain number, it means that a corresponding amount of total electric energy has been consumed in the power line. In practice, a constant parameter may be set to characterize the quantity of the energy metering pulses corresponding to electric energy of 1 kW·h.

Therefore, in one embodiment, accumulation of the values p of power, namely, the new electric energy value p+e after being calculated is further compared with the preset threshold th via the calculation-comparison circuit 100. In a case that the accumulation is greater than or equal to the preset threshold th, the counter circuit 200 may generate an energy metering pulse, and the value e of current energy is set to be the difference p+e-th between the accumulation and the preset threshold th, facilitating subsequent electric energy metering. In a case that the accumulation is less than the preset threshold th, current energy consumption is not sufficient for outputting the energy metering pulse, and the value e of current energy is merely set to be the new value p+e of electric energy, which is acquired through accumulation.

In one embodiment, a counting value set in the counter circuit 200 may be configured to adjust a pulse width of the outputted energy metering pulse.

The circuit for metering energy accumulation according to an embodiment of the present disclosure includes the calculation-comparison circuit 100 and the counter circuit 200 that are connected. The calculation-comparison circuit 100 is configured to: calculate the accumulation of the value of power in power consumption data and the value of current energy, and the difference between the accumulation and the preset threshold; output the flag bit, characterizing whether the difference being less than zero, to the counter circuit 200; set the value of current energy to be the difference in the case that the difference is not less than zero; and set the value of current energy to be the accumulation in the case that the difference is less than zero. The counter circuit 200 is configured to output the energy metering pulse in the case that the difference is not less than zero.

According to embodiments of the present disclosure, the value of power in the power consumption data is accumulated and the accumulation is compared with the preset threshold via the calculation-comparison circuit. Thereby, the energy metering pulse is outputted in a case that the accumulation is greater than or equal to the preset threshold. Calculation in electric energy metering is specifically implemented, effectively improving electric energy metering efficiency and product economic benefit.

Figure 2:
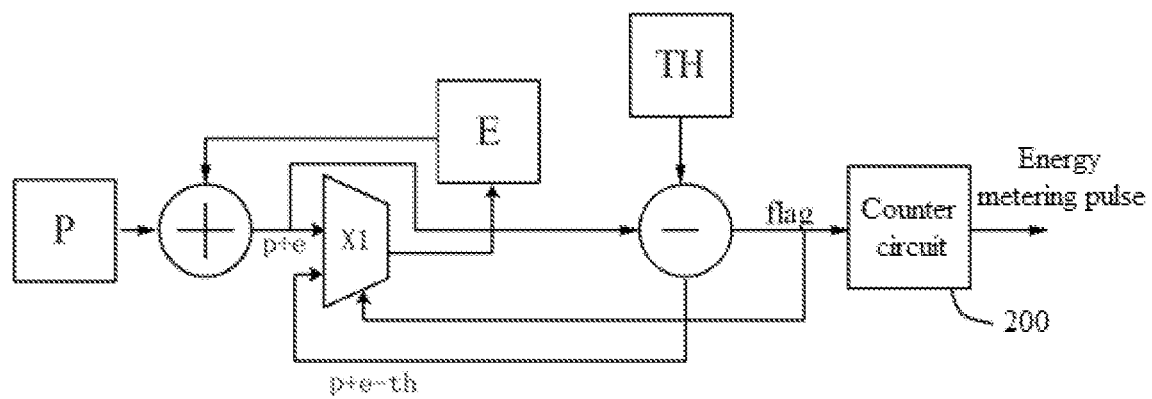
FIG. 2 is a schematic structural diagram of a circuit for metering energy accumulation according to an embodiment of the present disclosure.

Reference is made to FIG. 2, which is a schematic structural diagram of a circuit for metering energy accumulation according to an embodiment of the present disclosure.

In the circuit for metering energy accumulation according to one embodiment, the calculation-comparison circuit 100 includes: a power register P configured to refresh the value p of power in the power consumption data, an energy register E configured to store the value e of current energy, a threshold register TH configured to store the preset threshold th, an adder, a subtractor, and a first multiplexer X1.

Input ends of the adder are connected to the power register P and the energy register E, respectively, for calculating the accumulation. An output end of the adder is connected to a first input end of the first multiplexer X1. An output end of the first multiplexer X1 is connected to the energy register E.

Input ends of the subtractor are connected to the adder and the threshold register TH, respectively, for calculating the difference between the accumulation and the preset threshold th and generating the flag bit. An output end of the subtractor for the difference is connected to a second input end of the first multiplexer X1. An output end of the subtractor for the flag bit is connected to a selection control end of the first multiplexer X1 and the counter circuit 200.

In response to the difference being positive, the first multiplexer X1 is configured to output and write the difference to the energy register E. In response to the difference being negative, the first multiplexer X1 is configured to output and write the accumulation into the energy register E.

The multiplexer is configured to select a source of an operand. The multiplexer is capable to select a signal from multiple input signals that are analog or digital, and forward the selected signal. Thereby, different selected signals can be outputted via a same output line under different selection control signals.

In one embodiment, relevant dedicated registers are designed and used for electric energy metering, and include the power register P, the energy register E, and the threshold register TH. Word lengths of the value p of power, the value e of current energy, and the preset threshold th all may be 48 bits. Accordingly, word lengths of the three dedicated registers, the adder, and subtractor are also 48 bits. An accumulation frequency of the value p of power may be selected as 204.8 kHz.

Using dedicated registers reduces an overhead of stack-push and stack-pop, thereby improving processing efficiency significantly. In addition, a connection relationship among other related devices, such as the adder and the first multiplexer X1, is also designed based on a requirement on electric energy metering, greatly reducing an overhead for signal flow.

Figure 3:
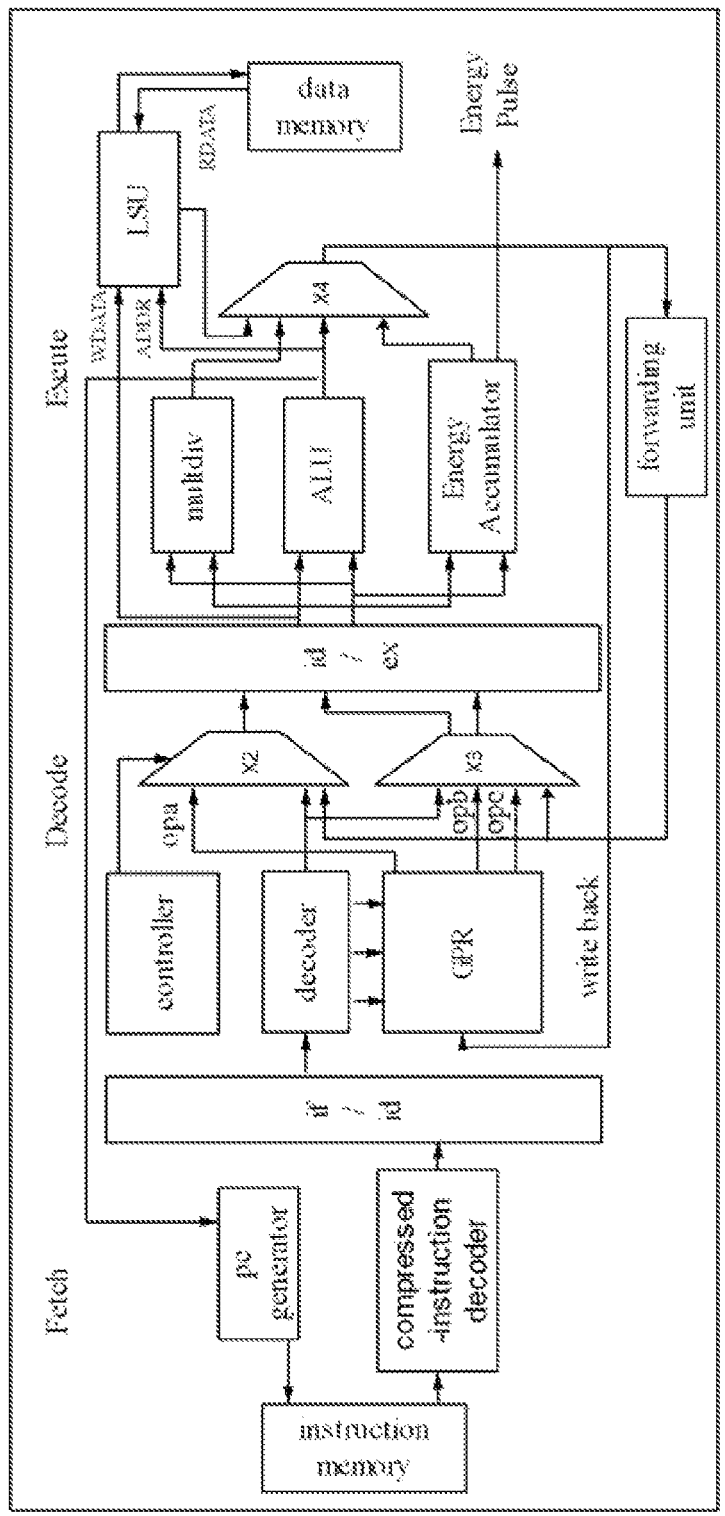
FIG. 3 is a schematic structural diagram of an MCU for metering electric energy according to an embodiment of the present disclosure.

Reference is made to FIG. 3. An MCU for metering electric energy is provided according to an embodiment of the present disclosure. The MCU is of a three-stage pipeline structure, and includes an instruction fetch module (Fetch), a decoding module (Decode), and an execution module (Execute). The execution module includes the aforementioned circuit for metering energy accumulation.

According to embodiments of the present disclosure, the value of power in the power consumption data is accumulated and the accumulation is compared with the preset threshold via the calculation-comparison circuit in the MCU for metering electric energy. Thereby, the energy metering pulse is outputted in a case that the accumulation is greater than or equal to the preset threshold. Calculation in electric energy metering is specifically implemented, effectively improving electric energy metering efficiency and product economic benefit.

In one embodiment, the instruction fetch module in the MCU for metering electric energy includes: a program counting generator (PC generator) and a compressed-instruction decoder.

The PC generator is configured to determine an address of a to-be-fetched instruction.

The compressed-instruction decoder is connected to the PC generator, and configured to fetch a target instruction from an instruction memory according to the address of the to-be-fetched instruction.

The compressed-instruction decoder is further configured to convert the target instruction from a 16-bit instruction to a 32-bit instruction.

In one embodiment, the decoding module in the MCU for metering electric energy includes an instruction register (if/id), a controller, a decoder, a general-purpose register (GPR), a second multiplexer X2, and a third multiplier X3.

The instruction register is connected to the compressed-instruction decoder, and configured to control instruction flow. The decoder is connected to the instruction register, and configured to decode the target instruction and output the decoded target instruction to the second multiplexer X2 and the third multiplexer X3. An output end of the controller is connected to a selection control end of the second multiplexer X2. An input end of the GPR is connected to the decoder, a first output end of the general-purpose register is connected to the second multiplexer X2, and a second output end and a third output end of the GPR are both connected to the third multiplexer X3. The controller is configured to generate a signal to flush and stop a pipeline.

In one embodiment, the execution module in the MCU for metering electric energy includes a data register (id/ex), a multiplier or divider (multdiv), an arithmetic logic unit (ALU), a fourth multiplexer X4, a load-store unit (LSU), a forwarding unit, and the circuit for metering energy accumulation (Energy Accumulator).

Input ends of the data register are connected to an output end of the second multiplexer X2 and an output end of the third multiplexer X3, respectively. An output end of the data register is connected to the multiplier or divider, the ALU, and the circuit for metering energy accumulation, for controlling data flow.

An output end of the multiplier or divider is connected to the fourth multiplexer X4. An output end of the ALU is connected to the fourth multiplexer X4 and an address input end of the LSU. An output end of the circuit for metering energy accumulation is connected to the fourth multiplexer X4. A data input end of the LSU is connected to the data register, for reading from or writing into a data memory, a write-back port of the ALU is connected to the fourth multiplexer X4.

An input end of the forwarding unit is connected to an output end of the fourth multiplexer X4. An output end of the forwarding unit is connected to the second multiplexer X2, for forwarding data.

In one embodiment, the MCU for metering electric energy is a RISC-V MCU. Architecture of the RISC-V MCU applies a RISC-V instruction set. The RISC-V instruction set is an open source instruction set designed by Berkeley Architecture Group. The RISC-V instruction set facilitates structural design and instruction development of calculations in electric energy metering, and reduces reliance on a single IP provider. Thereby, costs are reduced.

Figure 4:
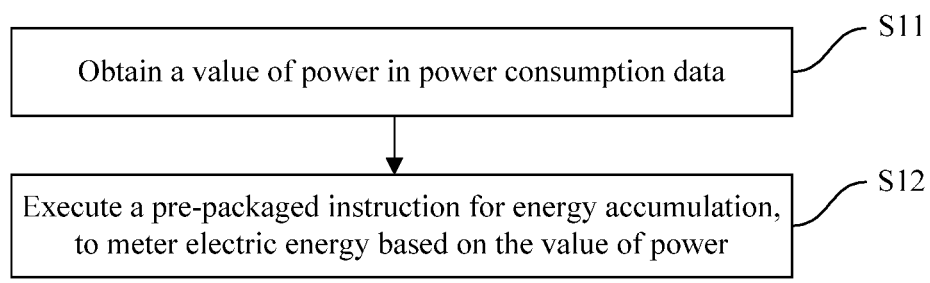
FIG. 4 is a flowchart of a method for metering energy accumulation according to an embodiment of the present disclosure.

Reference is made to FIG. 4. A method for metering energy accumulation is provided according to an embodiment of the present disclosure. The method is applied to the aforementioned MCU for metering electric energy, and includes steps S11 and S12.

In step S11, a value of power in power consumption data is obtained.

In step S12, a pre-packaged instruction for energy accumulation is executed, to meter electric energy based on the value of power.

The execution module of the MCU for metering electric energy when executing the energy accumulation instruction is configured to perform following operatons.

The accumulation of the value p of power and the value e of current energy is calculated. The difference between the accumulation and a preset threshold th is calculated. The energy metering pulse is outputted and the value e of current energy is set to be the difference, in the case that the difference is not less than zero. The value e of current energy is set to be the accumulation, in the case that the difference is less than zero.

In the method for metering energy accumulation according to embodiments of the present disclosure, the value of power in the power consumption data is accumulated and the accumulation is compared with the preset threshold via the calculation-comparison circuit. Thereby, the energy metering pulse is outputted in a case that the accumulation is greater than or equal to the preset threshold. Calculation in electric energy metering is specifically implemented, effectively improving electric energy metering efficiency and product economic benefit.

Specifically, the method for metering energy accumulation for electric energy metering according to this embodiment of the present disclosure may be applied to any of the aforementioned MCUs for metering electric energy. In one embodiment, the MCU for metering electric energy may be a RISC-V MCU. Based on the open source characteristic of the RISC-V MCU, the instruction for energy accumulation for electric energy metering is designed based on architecture of the RISC-V instruction set. The MCU is capable to meter energy accumulation only by reading and executing the instruction for energy accumulation. There is only one piece of assembly code, and thereby processing efficiency is significantly improved.

Reference is made to Table 1 for details. Table 1 illustrates assembly programs corresponding calculations for energy accumulation in conventional technology and this embodiment. It can be seen from Table 1 that in a case that the instruction for energy accumulation is designed in pre-packaging, only a line of assembly program, i.e. the instruction for energy accumulation, is necessary according to this embodiment. A code size is significantly reduced. Further given the aforementioned dedicated registers, an overhead of stack-push and stack-pop is reduced.

TABLE 1

| ARM M0 | RISC-V MCU without an instruction for energy accumulation | RISC-V MCU with an instruction for energy accumulation |
| --- | --- | --- |
| adds r3, r3, r1 | add a2, a2, a0 | acc e, p, th, e |
| adcs r4, r4, r2 | situ a0, a2, a0 | |
| cmp r2, r4 | add a3, a3, a1 | |
| bhi .L2 | add a3, a3, a0 | |
| ldr r2, [r7, #20] | mv a1, a3 | |
| ldr r3, [r7, #28] | mv a0, a2 | |

TABLE 1-continued

| ARM M0 | RISC-V MCU without an instruction for energy accumulation | RISC-V MCU with an instruction for energy accumulation |
|---|---|---|
| cmp r2, r3 | bltu a3, a5, 34 <.L2> | |
| bne .L5 | beq a5, a3, 30 <.L7> | |
| .L5: | <.L5>: | |
| subs r1, r1, r3 | sub a0, a2, a4 | |
| sbcs r2, r2, r4 | sub a3, a3, a5 | |
| movs r2, #1 | sltu a2, a2, a0 | |
| str r2, [r3] | lui a5, 0x0 | |
| .L2: | li a4, 1 | |
| movs r2, #0 | sub a1, a3, a2 | |
| str r2, [r3] | sw a4, 0(a5) | |
| | <.L7>: | |
| | bgeua2, a4, 16 <.L5> | |
| | <.L2>: | |
| | lui a5,0x0 | |
| | sw zero, 0(a5) | |

The instruction for energy accumulation designed in this embodiment is "acc e,p,th,e". A corresponding pseudo code is specifically is as follows if (e+p is larger than th)
{e=e+p−th;
Flag=1;}
Else
{e=e+p;
Flag=0;}

RISC-V instructions consist of four basic instruction sets and five extended instruction sets. Reference is made to Table 2 for details. Relevant content of the instruction sets is listed in Table 2. The basic instruction sets include RV32I, RV32E, RV64I, and RV128I. The extended instruction sets include RVM, RVA, RVF, RVD, and RVC.

TABLE 2

| | | Instruction | |
|---|---|---|---|
| Type of Instructions | Name | Number of in- structions | Definition |
| Basic instruction set | RV32I | 47 | 32-bit integer instruction set, 32 GPRs |
| | RV32E | 47 | subset of RV32I, 16 GPRs |
| | RV64I | 59 | 64-bit integer instruction set |
| | RV128I | 71 | 128-bit integer instruction set |
| Extended instruction set | RVM | 8 | integer multiply/divide instruction |
| | RVA | 11 | atomic operation instruction |
| | RVF | 26 | single precision floating point instruction |
| | RVD | 26 | double precision floating point instruction |
| | RVC | 46 | compression instruction |

In one embodiment, the basic instruction set RV32E and the extended instruction sets RVM and RVC may be selected to form an instruction set RV32EMC, including 16 GPRs, an integer multiplication/division instruction, a 16-bit compression instruction, and a 32-bit basic integer instruction.

The instruction for energy accumulation may be defined according to a standard R-type instruction format. A format of the R-type instruction may be as shown in Table 3. Table 3 shows operation codes corresponding to each data bit in a 32-bit instruction.

TABLE 3

| 31 | 25 24 | 20 19 | 15 14 | 12 11 | 7 6 | 0 |
|---|---|---|---|---|---|---|
| funct7 | r2 | r1 | funct3 | rd | opcode | |
| 0100001 | scr2 | scr1 | 000 | dest/scr3 | 0110011 | |

Further, a microprocessor for metering electric energy is provided according to an embodiment of the present disclosure. The microprocessor includes any of the aforementioned MCUs for metering electric energy.

According to embodiments of the present disclosure, the value of power in the power consumption data is accumulated and the accumulation is compared with the preset threshold via the calculation-comparison circuit of the microprocessor. Thereby, the energy metering pulse is outputted in a case that the accumulation is greater than or equal to the preset threshold. Calculation in electric energy metering is specifically implemented, effectively improving electric energy metering efficiency and product economic benefit.

Detailed content regarding the microprocessor for metering electric energy may refer to the foregoing detailed description of the MCU for metering electric energy, and is not repeated herein.

The above embodiments in this specification are described in a progressive manner. Each of the embodiments is mainly focused on describing its differences from other embodiments, and references may be made among these embodiments with respect to the same or similar portions among these embodiments.

It should be noted that, the relationship terms such as "first", "second" and the like are only used herein to distinguish one entity or operation from another, rather than to necessitate or imply that an actual relationship or order exists between the entities or operations. Furthermore, the terms such as "include", "comprise" or any other variants thereof means to be non-exclusive. Therefore, a process, a method, an article or a device including a series of elements include not only the disclosed elements but also other elements that are not clearly enumerated, or further include inherent elements of the process, the method, the article or the device. Unless expressively limited, the statement "including a . . . " does not exclude the case that other similar elements may exist in the process, the method, the article or the device other than enumerated elements.

According to the description of the disclosed embodiments, those skilled in the art can implement or use the present disclosure. Various modifications made to these embodiments may be obvious to those skilled in the art, and the general principle defined herein may be implemented in other embodiments without departing from the spirit or scope of the present disclosure. Therefore, the present disclosure is not limited to the embodiments described herein but confirms to a widest scope in accordance with principles and novel features disclosed in the present disclosure.

The invention claimed is:

1. A circuit for metering energy accumulation, comprising a calculation-comparison circuit and a counter circuit that are connected, wherein:
   the calculation-comparison circuit is configured to:
      calculate an accumulation of a value of power in power consumption data and a value of current energy, and a difference between the accumulation and a preset threshold;
      output a flag bit, characterizing whether the difference being less than zero, to the counter circuit;

set the value of current energy to be the difference in a case that the difference is not less than zero; and set the value of current energy to be the accumulation in a case that the difference is less than zero; and the counter circuit is configured to output an energy metering pulse in the case that the difference is not less than zero.

2. The circuit for metering energy accumulation according to claim 1, wherein the calculation-comparison circuit comprises:

a power register, configured to refresh the value of power in the power consumption data;

an energy register, configured to store the value of current energy;

a threshold register, configured to store the preset threshold, an adder, a subtractor, and a first multiplexer;

an adder;

a subtractor; and a first multiplexer;

wherein:

input ends of the adder are connected to the power register and the energy register, respectively, for calculating the accumulation;

an output end of the adder is connected to a first input end of the first multiplexer, and an output end of the first multiplexer is connected to the energy register;

input ends of the subtractor are connected to the adder and the threshold register, respectively, for calculating the difference between the accumulation and the preset threshold and generating the flag bit;

an output end of the subtractor for the difference is connected to a second input end of the first multiplexer, and an output end of the subtractor for the flag bit is connected to a selection control end of the first multiplexer and the counter circuit; and the first multiplexer is configured to output and write the difference to the energy register in response to the difference being positive, and output and write the accumulation to the energy register in response to the difference being negative.

3. A microcontroller unit (MCU) for metering electric energy, wherein:

the MCU is of a three-stage pipeline structure, and comprises an instruction fetch module, a decoding module, and an execution module; and the execution module comprises the circuit for metering energy accumulation according to claim 1.

4. The MCU for metering electric energy according to claim 3, wherein the instruction fetch module comprises:

a program counting generator, configured to determine an address of a to-be-fetched instruction; and a compressed-instruction decoder connected to the PC generator, configured to fetch a target instruction from an instruction memory according to the address of the to-be-fetched instruction.

5. The MCU for metering electric energy according to claim 4, wherein the compressed-instruction decoder is further configured to convert the target instruction from a 16-bit instruction to a 32-bit instruction.

6. The MCU for metering electric energy according to claim 5, wherein:

the decoding module comprises an instruction register, a controller, a decoder, a general-purpose register, a second multiplexer, and a third multiplier;

the instruction register is connected to the compressed-instruction decoder, and configured to control instruction flow;

the decoder is connected to the instruction register, and configured to decode the target instruction and output the decoded target instruction to the second multiplexer and the third multiplexer;

an output end of the controller is connected to a selection control end of the second multiplexer; and an input end of the general-purpose register is connected to the decoder, a first output end of the general-purpose register is connected to the second multiplexer, and a second output end and a third output end of the general-purpose register are both connected to the third multiplexer.

7. The MCU for metering electric energy according to claim 6, wherein:

the execution module comprises a data register, a multiplier or divider, an arithmetic logic unit, a fourth multiplexer, a load-store unit a forwarding unit and the circuit for metering energy accumulation;

input ends of the data register are connected to an output end of the second multiplexer and an output end of the third multiplexer, respectively;

an output end of the data register is connected to the multiplier or divider, the arithmetic logic unit, and the circuit for metering energy accumulation, for controlling data flow;

an output end of the multiplier or divider is connected to the fourth multiplexer;

an output end of the arithmetic logic unit is connected to the fourth multiplexer and an address input end of the load-store unit;

an output end of the circuit for metering energy accumulation is connected to the fourth multiplexer;

a data input end of the load-store unit is connected to the data register, for reading from or writing into a data memory;

a write-back port of the arithmetic logic unit is connected to the fourth multiplexer;

an input end of the forwarding unit is connected to an output end of the fourth multiplexer; and an output end of the forwarding unit is connected to the second multiplexer, for forwarding data.

8. The MCU for metering electric energy according to claim 3, wherein the MCU for metering electric energy is a RISC-V MCU.

9. A method for metering energy accumulation, applied to the MCU for metering electric energy according to claim 3, comprising:

obtaining the value of power in the power consumption data; and executing a pre-packaged instruction for energy accumulation, to meter electric energy based on the value of power;

wherein the execution module of the MCU for metering electric energy when executing the energy accumulation instruction is configured to:

calculate the accumulation of the value of power and the value of current energy;

calculate the difference between the accumulation and a preset threshold;

output the energy metering pulse and set the value of current energy to be the difference, in the case that the difference is not less than zero; and set the value of current energy to be the accumulation, in the case that the difference is less than zero.

10. A microprocessor for metering electric energy, comprising the MCU for metering electric energy according to claim 3.

* * * * *